United States Patent [19]
Morez et al.

[11] 4,077,013
[45] Feb. 28, 1978

[54] AUDIO POWER AMPLIFIER WITH AUTOMATIC BIAS CONTROL

[75] Inventors: Gene S. Morez, Morton Groove; James F. Griffin, Mount Prospect, both of Ill.

[73] Assignee: Norlin Music, Incorporated, Lincolnwood, Ill.

[21] Appl. No.: 692,781

[22] Filed: Jun. 4, 1976

[51] Int. Cl.² .................................................. H03F 3/26
[52] U.S. Cl. ...................................... 330/267; 330/268; 330/296
[58] Field of Search .................... 330/13, 15, 17, 22, 330/25, 40, 136, 127

[56] References Cited
U.S. PATENT DOCUMENTS

| | | | |
|---|---|---|---|
| 3,439,284 | 4/1969 | Carlson | 330/25 X |
| 3,484,867 | 12/1969 | Babcock | 330/13 |
| 3,914,703 | 10/1975 | Stauffer | 330/13 X |
| 3,984,783 | 10/1976 | Bickley | 330/25 X |

*Primary Examiner*—Lawrence J. Dahl
*Attorney, Agent, or Firm*—Oblon, Fisher, Spivak, McClelland & Maier

[57] ABSTRACT

A power amplifier with an automatic bias control circuit is disclosed. The amplifier includes two complementary Darlington pairs operating in a push-pull mode providing output power. A bias control network including a switching transistor is coupled to the base circuits of the Darlington pairs for controlling the bias current delivered to the pairs. The transistor is switched on and off by a detecting circuit which senses the presence of input signals applied to the amplifier. The bias control network operates to minimize power consumption by the Darlington pairs when no input signal is present and to raise the bias level of the Darlington pairs without distortion in the output signal when an input is applied to the amplifier.

10 Claims, 2 Drawing Figures

AUDIO POWER AMPLIFIER WITH AUTOMATIC BIAS CONTROL

BACKGROUND OF THE INVENTION

Field of the Invention

The present invention relates to amplifier circuitry, and more particularly to a power amplifier with an automatic bias control.

Description of the Prior Art

A problem that exists in power amplifiers, and particularly in solid state audio power amplifiers, is that of excessive power dissipation in the output stages. As is well known to those skilled in the art, excessive power dissipation in the output stages tends to increase the temperature of the active output amplifier elements which in turn creates a regenerative effect tending to cause increased current flow and power dissipation. In extreme instances thermal runaway can result.

To reduce excessive power consumption and heat generation in the output stages, it has been conventional to select output biasing components of the proper magnitude to provide a low idle current and to ensure Class AB operation for low idle current and minimum heat generation. In practice, however, the proper selection of output biasing components to achieve these desirable ends is very difficult. Accordingly, the output biasing elements are often improperly selected with the result that either a high output idle current exists causing the generation of excessive heat in the output components, or Class B output conditions occur, with resulting distortion in the output signal due to crossover.

In high fidelity audio power amplifiers that are to be operated for long intervals neither excessive heat generation nor crossover distortions are permissible. Accordingly, a need exists for an improved biasing arrangement which eliminates both excessive current dissipation in the output stages and prevents distortion due to the occurrence of Class B output conditions.

SUMMARY OF THE INVENTION

Accordingly, one object of this invention is to provide a novel audio power amplifier with an improved automatic biasing control circuit.

Another object of the present invention is the provision of a novel amplifier bias control circuit.

A still further object of the present invention is the provision of a novel circuit for reducing idle current dissipation in a power amplifier.

A still further object of the present invention is the provision of a novel solid state power amplifier characterized by low idle current dissipation without distortion.

A still further object of the present invention is the provision of a low cost, highly efficient bias control circuit for reducing idle power consumption and heat generation in audio power amplifiers without distortion.

Briefly, these and other objects of the present invention are achieved by the provision in a power amplifier of an input signal detecting network which produces a control signal when an input signal is applied to the amplifier. The control signal is used to switch a bias control transistor which in turn varies the bias current delivered to a pair of output power amplifying circuits.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENT

Figure 1:
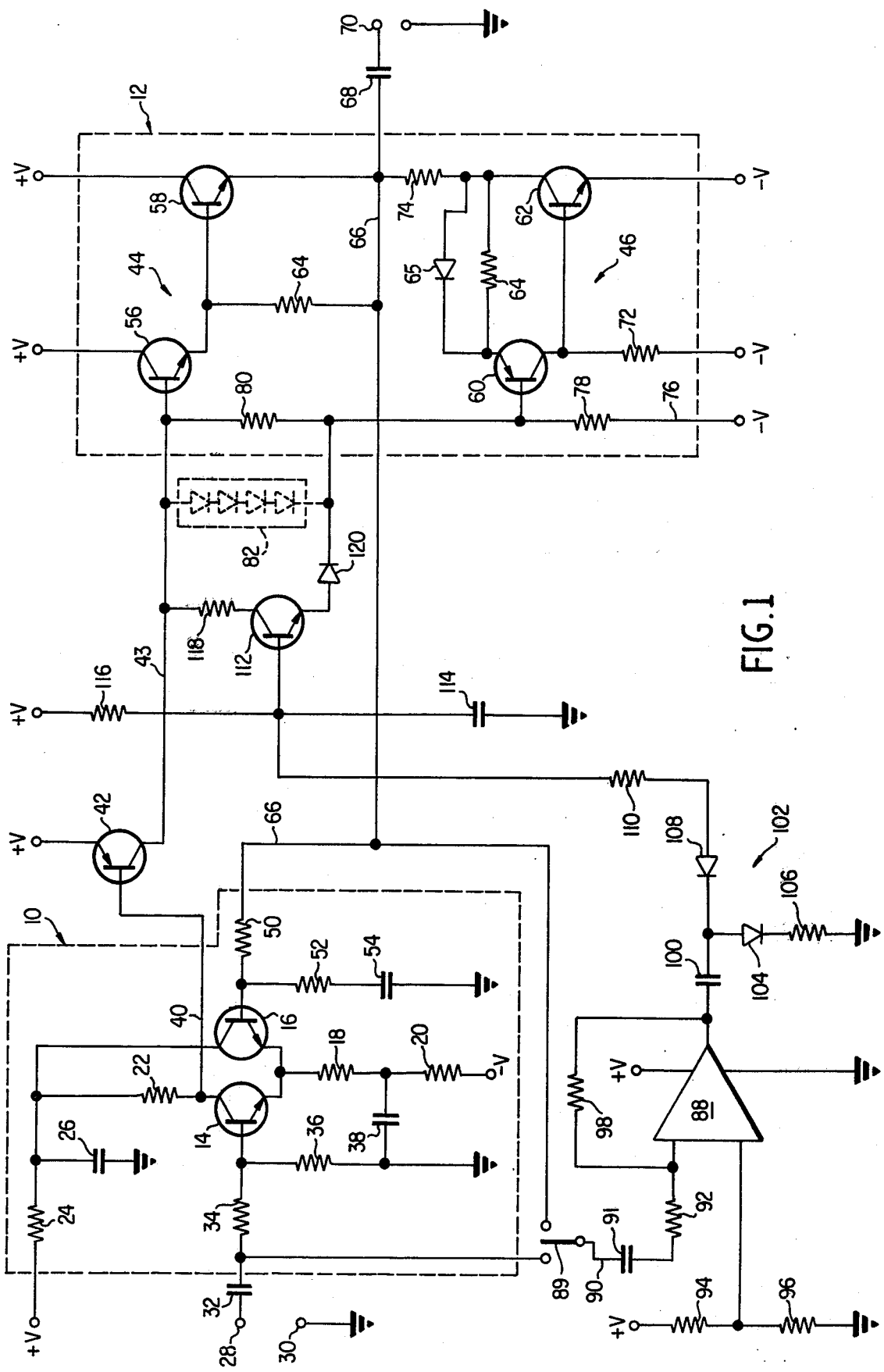
FIG. 1 is a schematic diagram of the circuit of the present invention.

Referring now to the drawings, and more particularly to FIG. 1 thereof, an audio power amplifier including the novel automatic bias provisions of the present invention is illustrated schematically. The amplifier includes an input stage 10 and an output stage 12 having coupled to them the novel bias control circuitry of the present invention and by other coupling circuitry.

The input stage 10 includes a differential voltage amplifier of essentially conventional structure including a pair of NPN transistors 14 and 16 having their emitter electrodes connected together. The interconnected emitter electrodes are coupled through a pair of resistors 18 and 20 to a source of negative potential $-V$. The collector electrode of the transistor 14 is similarly coupled through a pair of resistors 22 and 24 to a source of positive potential $+V$, while the collector of the transistor 16 is coupled to the source of positive potential through only the resistor 24. A filtering capacitor 26 is coupled between the resistors 22 and 24 to a suitable reference potential such as ground.

Input signals are applied to the input stage 10 by means of a pair of input terminals 28 and 30. Input terminal 30 is grounded, while input terminal 28 is connected through a coupling capacitor 32 and a coupling resistor 34 to the base electrode of transistor 14. Biasing circuitry, including resistor 36, is coupled between the base electrode of transistor 14 and ground potential. A decoupling capacitor 38 is provided between the base and emitter circuits of of transistor 14.

An output signal from the input stage 10 is applied through a line 40 coupled to the collector of transistor 14 to the base electrode of a pre-driver transistor 42 which functions as a current preamplifier for driving two power amplifying Darlington pairs 44 and 46 which operate in a push-pull mode. The pre-driver transistor 42 is coupled at its emitter to the source of positive potential $+V$ and at its collector electrode over a line 43 to the base electrode of Darlington circuit 44 and to Darlington circuit 46 through bias circuitry.

The Darlington pair 44 consists of two NPN transistors 56 and 58 while the Darlington pair 46 includes a PNP transistor 60 and an NPN transistor 62. A resistor 64 and a diode 65 are coupled in parallel between the emitter of the transistor 60 and the collector of the transistor 62 to form a quasi-complimentary configuration with respect to the Darlington pair 44.

Both of the transistors in the Darlington pair 44 are coupled at their collector electrodes to the source of positive potential $+V$. The emitter of transistor 56 is coupled to the base of transistor 58 and is also coupled through a resistor 64 to a line 66 which is in turn connected through an output coupling capacitor 68 to an output terminal 70. The emitter of transistor 58 is directly coupled to the line 66.

The transistors of the Darlington pair 46 are coupled to the negative voltage source $-V$, the transistor 62 being directly coupled to the negative potential source at its emitter electrode, while the transistor 60 is coupled at its collector electrode to the negative potential source through resistor 72. The collector of the transistor 60 is coupled to the base of the transistor 62, while the collector of the transistor 62 is connected through a coupling resistor 74 to the line 66 and consequently to the output terminal 70 through an output coupling capacitor 68.

Static biasing of the output Darlington pairs 44 and 46 is supplied through a biasing line 76 which connects the negative potential source −V through a first biasing resistor 78 to the base electrode of transistor 60 and through a second biasing resistor 80 to the base electrode of transistor 56. A plurality of diodes 82 is conventionally coupled in parallel with the second biasing resistor 80 for the purpose of temperature stabilizing the output stage 12. The signal on line 66 is also fed back through resistor 50 to the base of transistor 16, this feedback signal serving to stabilize the high gain amplifier in the input stage. Resistor 52 and capacitor 54 set the gain and low-end frequency response of the transistor 16.

As mentioned previously, the output stage 12 of the illustrated amplifier circuit is biased by the resistors 80 and 78 in conjunction with the plural diodes 82. The diodes provide temperature compensation and are normally mounted on the same heat sink as the output transistors 58 and 62. The voltage drop across the plural diodes 82 provides a corrected voltage differential between the base electrodes of transistors 56 and 60, but various $V_{BE}$ drops in the drivers and the output devices, as well as the variance in forward voltage drop across the plural diodes 82 makes the selection of the value of resistor 80 very critical. More particularly, to provide low idle current and to ensure Class AB operation for low idle current and minimum heat generation, the value of resistor 80 must be selected with great care. In practice, the value of the resistor 80 normally cannot be selected with the proper precision resulting in either a high output idle current and the generation of excessive heat (and possible thermal runaway) in the output stage, or a Class B output condition which results in crossover and easily detectable distortion in the output signal.

To remove the critical dependency of the amplifier circuit on the value of the biasing resistor 80, a dynamic bias control circuit has been added to the previously described amplifier circuitry in accordance with the teachings of the present invention. More particularly, the bias control circuitry includes a conventional integrated circuit amplifier 88 preferably having a gain that is very high relative to the gain of the input stage 10. One input of the amplifier 88 is coupled either to input terminal 28 or output line 66, depending on the position of switch 89, through a line 90, capacitor 91 and coupling resistor 92. A second input of the amplifier 88 is coupled to a bias ing source which could be a voltage divider consisting of a first resistor 94 coupled between the input of amplifier 88 and the source of positive potential +V and a second resistor 96 coupled between the input of the amplifier and ground potential as shown in FIG. 1, or could merely be a direct connection to ground or other desired potential. A feedback resistor 98 of large magnitude is coupled across the amplifier 88 between the input coupling resistor 92 and the output of the amplifier. The output of the amplifier 88 is fed through a coupling capacitor 100 to a detector circuit 102 for producing a DC bias control signal, and which includes a first diode 104 having its cathode coupled to ground potential through a resistor 106. A second diode 108 of the detector circuit is connected to the coupling capacitor 100 at its cathode and its anode is connected through a coupling resistor 110 to the base electrode of a bias control transistor 112. The base circuit of the bias control transistor 112 also includes a grounded capacitor 114 and a resistor 116 coupled to the positive potential source +V for providing bias current. The collector electrode of the bias control transistor 112 is coupled through a load resistor 118 to the line 43 connecting transistor 42 with the base circuits of the transistors 56 and 60. The transistor 112 is coupled through a protective diode 120 across the temperature stabilization diodes 82 and across the biasing resistor 80.

The purpose of the bias control circuitry described above is to detect the presence of an input signal applied to the amplifier input terminals 28 and 30 (either directly from the input terminals or from the resulting signal appearing on output line 66) and to use the detected signal to switch the bias control transistor 112 between its conductive and nonconductive states in order to vary the bias between the power output transistors. More particularly, when an input signal is received, the integrated circuit amplifier 88 amplifies the input signal and applies the amplified input signal through capacitor 100 coupling to diode 104 which, when conducting, lowers the reference voltage at which diode 108 conducts to divide the voltage present at the base of the bias control transistor 112. When this happens, the transistor 112 cuts off and the bias supply of the output stage is essentially controlled by the diodes 82 and resistor 80 which, in accordance with the teachings of the present invention, is selected to provide a worst case output current which is less than would be provided by a proportional input signal under normal operating conditions. Accordingly, the resistor 80 is selected so that the output stages always receive sufficient bias current to operate in a Class AB condition when an input signal is applied to the input terminals of the amplifier. On the other hand, when no input signal is applied to the input terminals of the amplifier, the bias control transistor is in its conductive state, thereby shunting the resistor 80 and reducing the bias current delivered to the output stages. The reduction in bias current is sufficient to reduce the output stage to Class B operation when no input signal is applied. The present invention, which is particularly suitable for use as an audio amplifier, permits the changeover from Class B to Class AB operation to occur with virtually no output distortion, and changeover occurring at an input signal level which is too low to be audible.

With switch 89 in the position shown in FIG. 1, connecting input terminal 28 to one input of amplifier 88, a very high gain amplifier 88, having an amplification of as much as 1000 to 1, may be required. Thus, the amplifier may be required to have two or more stages of amplification. By transferring switch 89 so as to connect output line 66 to the input of amplifier 88, advantage is taken of the amplification of the amplifier circuit itself, permitting a significantly lower power, and thus significantly less expensive, amplifier 88 to be utilized. One problem in using the signal on line 66 to control the automatic bias circuit is that it makes the circuit susceptible to noise either at the input or as developed within the amplifier circuit itself, the amplifier switching to Class AB operation in response to such noise rather than a true signal input.

Figure 2:
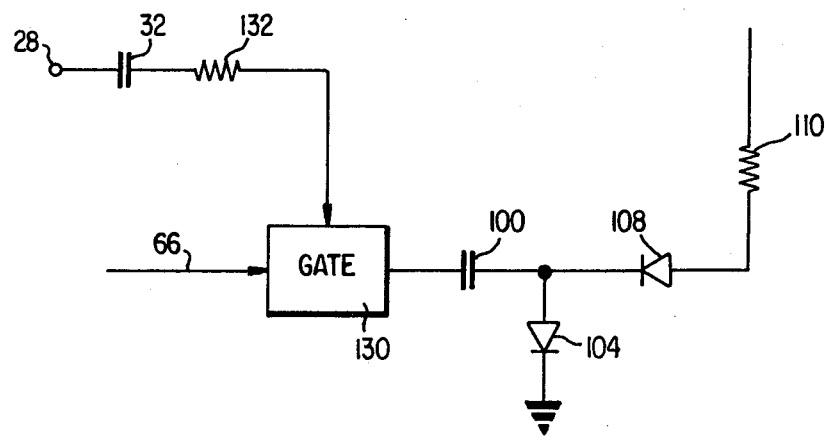
FIG. 2 is a schematic diagram of a low noise circuit for modifying a portion of the circuit of FIG. 1.

FIG. 2 shows a circuit adapted for overcoming this noise problem. For purposes of FIG. 2, it is assumed that the amplification within the power amplifier circuit itself is sufficient to switch transistor 112 so that amplifier 88 is no longer required. The signal on line 66 is applied to the information input of a standard gating circuit 130, the control input to which is obtained from input terminal 28 through capacitor 32 and resistor 132. Thus, a signal on line 66 is passed to control the bias control circuit in a manner previously described to switch the circuit from Class B to Class AB operation only in the event an input signal exceeding a predetermined threshhold is present at terminal 28. A noise signal appearing on line 66 will not be effective to alter the operating state of the amplifier.

Although the output Darlington pairs 44 and 46 are shown as composed of discrete components, integrated or prefabricated Darlington amplifiers may also be used with the circuit of the present invention. Thus the Darlington pairs may be fully complementary in structure rather than quasi-complementary as shown in FIG. 1. Further, while Darlington configurations have been utilized for purposes of illustration in the output stages of the amplifier for the preferred embodiment of the invention, the teachings of this invention may be practiced with any suitable power amplifier configuration and are particularly adapted for use with push-pull complimentary power amplifier configurations.

It is noted that, while in the preferred embodiment there is a hard switching of the transistor 112 from cut-off to full conduction when an audio signal is received, it is possible to change the bias more slowly in response to audio inputs so that the transistor is still partially conducting for low audio signals preventing excessive heating at these signal levels.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A power amplifier circuit including an automatic bias control comprising:
    power amplifier means including an input terminal for amplifying signals applied to said input terminal; and
    automatic bias control means coupled to said power amplifier for changing the state of said power amplifier from class B to class AB operation in response to an increasing signal level at said input terminal wherein said automatic bias control means includes
    a high gain amplifier,
    means for applying a signal which is a function of an input signal to said high gain amplifier,
    detector means coupled to said high gain amplifier for converting the output signal thereof to a bias control signal; and
    electronic switching means coupled to said detector circuit means for switching between conductive and non-conductive states in response to said bias control signal.

2. A power amplifier circuit as in claim 1, wherein said detector means comprises:
    first diode means having its anode coupled to said high gain amplifier means; and,
    second diode means having its cathode coupled to said high gain amplifier means and its anode coupled to said electronic switching means.

3. A power amplifier circuit as in claim 1, wherein said power amplifier means comprises:
    a pair of amplifying circuits connected in a push-pull configuration.

4. A power amplifier circuit as in claim 3, wherein:
    said power amplifier means comprises two complimentary Darlington pairs.

5. A power amplifier circuit as in claim 4, further comprising:
    a static biasing circuit coupled to said Darlington pairs for supplying bias current thereto; and
    wherein said electronic switching means is coupled in parallel with at least a portion of said static biasing circuit for changing the bias current supplied by said biasing circuit in response to said bias control signal.

6. A power amplifier circuit as in claim 5, wherein:
    said circuit is utilized as an audio amplifier; and,
    wherein said automatic bias control means is coupled to said power amplifier means so as to cause all crossovers between Class AB and Class B operation to occur at subaudio signal levels.

7. A power amplifier circuit including an automatic bias control comprising:
    power amplifier means including an input terminal for amplifying signals applied to said input terminal; and
    automatic bias control means coupled to said power amplifier for changing the state of said power amplifier from class B to class AB operation in response to an increasing signal level at said input terminal wherein said automatic bias control means includes
    a high gain amplifier, and
    means for applying a signal which is a function of an input signal to said high gain amplifier, the output from said high gain amplifier being a bias control signal.

8. A power amplifier circuit as in claim 7 wherein said means for applying a signal which is a function of an input signal includes:
    means for applying input signals to said high gain amplifier.

9. A power amplifier circuit as in claim 8 wherein said means for applying a signal which is a function of an input signal includes:
    means for applying the output signal from said power amplifier to the input of said high gain amplifier.

10. A push-pull power amplifier including a circuit for automatically controlling the biasing of the output stages of said power amplifier, comprising:
    first means coupled to said output stages for normally providing a selected bias resistance between said stages, said first means including a predetermined resistance, and switching means for partially shunting said resistance;
    second means coupled to said amplifier for applying an input signal to said amplifier; and,
    third means coupled to said first means for significantly increasing the bias resistance between said output stages in response to an input signal being applied to said amplifier, said third means including means for opening said switching means whereby said resistance is no longer shunted.

* * * * *